United States Patent
Edamura et al.

(10) Patent No.: US 8,231,759 B2
(45) Date of Patent: *Jul. 31, 2012

(54) PLASMA PROCESSING APPARATUS

(75) Inventors: Manabu Edamura, Ibaraki-ken (JP); Go Miya, Hachioji (JP); Ken Yoshioka, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/783,686

(22) Filed: May 20, 2010

(65) Prior Publication Data

US 2010/0263796 A1 Oct. 21, 2010

Related U.S. Application Data

(63) Continuation of application No. 12/567,137, filed on Sep. 25, 2009, now Pat. No. 7,744,721, which is a continuation of application No. 10/921,341, filed on Aug. 19, 2004, now abandoned.

(30) Foreign Application Priority Data

Apr. 13, 2004 (JP) ................................. 2004-117894

(51) Int. Cl.
*C23F 1/00* (2006.01)
*H01L 21/306* (2006.01)
*C23C 16/00* (2006.01)
(52) U.S. Cl. ................................. 156/345.48; 118/723 I
(58) Field of Classification Search .................. 118/715, 118/722, 723 R, 723 I, 723 IR, 723 AN; 156/345.45, 156/345.38, 345.49; 315/111.21, 111.51
See application file for complete search history.

(56) References Cited

U.S. PATENT DOCUMENTS

| | | | |
|---|---|---|---|
| 4,990,229 A | 2/1991 | Campbell | |
| 5,554,223 A | 9/1996 | Imahashi | |
| 5,681,418 A | 10/1997 | Ishimaru | |
| 5,753,044 A | 5/1998 | Hanawa | |
| 5,998,933 A | 12/1999 | Shun'ko | |
| 6,028,285 A * | 2/2000 | Khater et al. | 219/121.43 |
| 7,088,047 B2 | 8/2006 | Lee | |
| 7,744,721 B2 * | 6/2010 | Edamura et al. | 156/345.48 |

FOREIGN PATENT DOCUMENTS

JP 02-235332 9/1990
(Continued)

OTHER PUBLICATIONS

Kushner, Mark J., et al, "A Three-Dimensional Model for Inductively Coupled Plasma Etching Reactors: Azimuthal Symmetry, Coil Properties, and Comparison to Experiments," J. Appl. Phys. 80 (3), Aug. 1996, pp. 1337-1344. USA.

(Continued)

*Primary Examiner* — Maureen Gramaglia
(74) *Attorney, Agent, or Firm* — Antonelli, Terry, Stout & Kraus, LLP.

(57) ABSTRACT

A plasma processing apparatus includes a processing chamber, a sample stage for mounting an object to be processed, a power supply, and at least one induction coil connected to the power supply. The induction coil is formed by connecting at least two identical coil elements in a parallel circuit-like arrangement so that current flows in each of the plurality of identical coil elements in a same direction when viewed from the sample stage. The induction coil is positioned so that a center thereof corresponds to a center of the object, and input ends of the coil elements are displaced circumferentially at equal angular intervals calculated by dividing 360° by the number of identical coil elements.

5 Claims, 14 Drawing Sheets

FOREIGN PATENT DOCUMENTS

| | | |
|---|---|---|
| JP | 07-106095 | 4/1995 |
| JP | 08-321490 | 3/1996 |
| JP | 2003-086577 | 3/2003 |
| JP | 2004-506339 | 2/2004 |
| KR | 2002083097 A * | 11/2002 |
| WO | WO 02/15650 | 2/2002 |

OTHER PUBLICATIONS

Okumura, T., et al, "New Inductively Coupled Plasma Source Using a Multispiral Coil," Rev. Sci. Instrum. vol. 66, No. 11, Nov. 1995, pp. 5262-5265.

* cited by examiner

PLANES: 3, 3/2-TURN CIRCUITS: 4, TOTAL TURNS: 6

ONLY CIRCUIT 1 COIL IS SHOWN

PLANES: 3, 1-TURN CIRCUITS: 3, TOTAL TURNS: 3

PLASMA PROCESSING APPARATUS

CROSS REFERENCE TO RELATED APPLICATION

This application is a continuation of U.S. application Ser. No. 12/567,137, filed Sep. 25, 2009, now U.S. Pat. No. 7,744,721, which is a continuation of U.S. application Ser. No. 10/921,341, filed Aug. 19, 2004 now abandoned, the contents of which are incorporated herein by reference.

The present application is based on and claims priority of Japanese patent application No. 2004-117894 filed on Apr. 13, 2004, the entire contents of which are hereby incorporated by reference.

FIELD OF THE INVENTION

The present invention relates to a plasma processing apparatus preferably used for etching objects or depositing films in the process of manufacturing semiconductor devices, liquid crystal display substrates or the like.

DESCRIPTION OF THE RELATED ART

Along with the miniaturization of semiconductor devices, process conditions (process window) of a plasma process that realizes uniform processing to be carried out across the whole wafer surface have become narrower, so there are increasing demands for plasma processing apparatuses having more complete control of the states of the processes. In order to answer to such demands, it is required a plasma processing apparatus capable of controlling the plasma distribution, the process gas dissociation and the surface reaction within the reactor with very high accuracy.

At present, an RF inductively coupled plasma source is used as plasma source for the above-mentioned type of plasma processing apparatuses. One example of an inductively coupled plasma processing apparatus is provided in which a radio frequency on the order of a few hundred kHz to a few hundred MHz is supplied to an RF coil generally in the shape of a loop, a coil or a helical disposed outside the processing chamber via an insulating member such as a quartz forming a part of the chamber, and the induction field created via the coil accelerates the electrons in the plasma, thereby supplying energy to the process gas introduced to the interior of the processing chamber for generating plasma and maintaining the generated plasma (refer for example to patent document 1). Another example of an RF inductively coupled plasma processing apparatus has a coil disposed within the chamber, wherein a helical coil functioning as the RF induction coil is disposed in the chamber at a position confronting a semiconductor wafer which is the object to be processed (refer for example to patent document 2).

This type of plasma processing apparatus is called an inductively coupled plasma processing apparatus, since an induced current is generated in the plasma, and the plasma and RF coil are inductively coupled in a circuit-like manner (a transformer circuit in which the coil is regarded as the primary coil and the current in the plasma as the secondary coil). The inductively coupled plasma processing apparatus is advantageous since it can generate high density plasma on the order of $1 \times 10^{11}$ through $1 \times 10^{12}$ ($cm^{-3}$) in a low pressure of a few mTorr, generate plasma easily in a large area, and reduce the amount of contaminants entering the surface of the object being subjected to processing, by a simple and inexpensive arrangement using a simple coil and an RF power supply. In such apparatuses, high density plasma is generated at low pressure, according to which the ions have greater mean free path and are incident on the object being processed with advantageous directional property, so such apparatuses are specifically appropriate for microfabrication using plasma etching technology, and can realize high processing speed.

The semiconductor wafer or other objects subjected to plasma processing is substantially circular, so the chamber of the plasma processing apparatus in which the wafer is processed often has a correspondingly circular inner horizontal cross-section. In a plasma etching apparatus, for example, processing gas is introduced either from the center or the side wall of the chamber, and in most cases evacuated from the bottom. It is desirable that the wafer etching is completely uniform across the wafer surface, but in actual, the reaction on the wafer surface is not completely uniform due to the non-uniform distribution of plasma, dissociated species and reaction products within the reaction chamber. For example, the reaction products are generated from the wafer, so the concentration thereof is necessarily higher at the center of the chamber. Therefore, in order to overcome this etching non-uniformity caused by non-uniform concentration and to achieve uniform wafer etching, measures such as reducing the plasma density at the outer circumference than at the center or reducing the water temperature at the outer circumference than at the center are taken. On the other hand, non-uniformity in the circumferential direction of the wafer is sometimes caused due to the uneven gas flow or plasma generation, but unlike the non-uniformity in the radial direction of the wafer, the non-uniformity in the circumferential (azimuthal) direction can be solved easily. As for the gas flow, it is possible to make the circumferential flow uniform by optimizing the discharge mechanism disposed at the bottom of the chamber.

[Patent Document 1]
  Japanese Patent Application Laid-Open No. 2-235332
[Patent Document 2]
  Japanese Patent Application Laid-Open No. 7-106095
[Patent Document 3]
  Japanese Patent Application Laid-Open No. 8-321490
  (U.S. Pat. No. 5,753,044)
[Non-Patent Document 1]
  J. Appl. Phys. 80 (3), 1 Aug. 1996, p. 1337 "A three-dimensional model for inductively coupled plasma etching reactors", Mark J. Kushner et al.
[Non-Patent Document 2]
  Rev. Sci. Instrum. Vol. 66, No. 11, November 1995, p. 5262 "New inductively coupled plasma source using a multi-spiral coil", Okumura et al.

However, in an inductively coupled plasma processing apparatus, non-uniformity in the circumferential (azimuthal) direction occurs due to the configuration of the apparatus. That is, a coil always has an end connected to the RF power supply and another end connected to ground, and this coil configuration causes plasma non-uniformity in the circumferential direction. Further, since in the low density areas the electrons are directly accelerated by the voltage applied to the coil, plasma is generated in a capacitively-coupled manner and influences the process. Since the voltage applied to the coil is not constant, a large amount of such capacitively-coupled plasma may be generated in areas where the voltage is high, while in other cases, the current loss caused by parasitic capacitance existing in parallel to the coil may oppositely cause plasma density to be lower where the voltage is high, according to which non-uniformity in the circumferential direction occurs (for example, refer to non-patent document 1).

In order to solve this problem, a structure is proposed in which plural identical coils are arranged in parallel at even angular intervals. For example, there is a proposal of a structure in which three coil circuits are disposed at even angular intervals of 120° so as to improve the circumferential-direction uniformity (for example, refer to patent document 3). The coils are wound vertically, horizontally or along a dome structure. According to the disclosure of patent document 3 in which plural identical coil elements are connected in parallel in a circuit-like manner, the total inductance of the induction coil composed of plural coil elements is reduced. However, according to such arrangement, along with the increase of the number of coils, the power supply to the coils is restricted to be supplied only from the center of the arrangement, by which the limitation regarding the design of the apparatus becomes great.

A similar arrangement as the one disclosed in above patent document 3 is proposed, in which the plasma apparatus is equipped with four coil elements disposed at 90° intervals (for example, refer to non-patent document 2). The document discloses that when an induction coil is formed of four coil element circuits connected in parallel, it is known that the inductance thereof is reduced to 57% that of a single coil circuit. However, since the coils are disposed adjacent one another, due to mutual induction, the inductance is not reduced to the theoretical value of 25% of the case where four coils are disposed completely independently from one another.

Here, the RF voltage E applied to the coil is calculated by the equation $E=I \cdot Z$, wherein I represents coil current and Z represents impedance. According to equation $Z=2\pi f \cdot L$ in which f represents power supply frequency, when the same power is supplied, the reduction of induction causes voltage in the coil to be reduced and current to be increased. In designing an inductively coupled plasma apparatus, there are various factors in determining the most preferable level of current and voltage. The increased voltage causes the plasma to have better ignition property and low-density stability, but on the one hand, causes increase of damage caused by ion sputtering of the insulating member disposed between the induction coil and plasma. On the other hand, design-related problems occur by the increased current, such as heating, the loss caused thereby, and current resistance of the variable capacitor used in the matching network. The increase in voltage causes problems such as abnormal discharge, undesirable effect to plasma, and voltage resistance of the variable capacitor.

Now, we will assume that there is a need to design an induction coil having a certain amount of inductance (for example, 1 μH) from the viewpoint of current and voltage resistance of the matching network. By using an induction coil of 1 μH with a single turn, the total number of turns is, of course, one. By referring to the data disclosed in the paper of Okumura et al. (non-patent document 2), if a plurality of such coils are connected in parallel in a circuit-like manner to form a four-turn arrangement with 90° angular intervals, the inductance becomes 0.57 μH, and the total number of turns will be four. This inductance is too small, so in order to achieve an inductance of 1 μH with four parallel coil circuits, the coil must have approximately 1.5 turns per circuit, and the total number of turns must be six. In other words, in order to adopt a parallel coil arrangement, the total number of turns is significantly increased in order to achieve the same inductance as that of the single coil. In order to achieve the inductance of a single coil with a single turn by an arrangement composed of four parallel circuit coils, one coil circuit must have 1.5 turns, resulting in a total of six turns. According to patent document 3, the coil is wound vertically or along a dome structure. According to non-patent document 2, the coil is disposed horizontally on a plane. However, the difficulty of adopting a parallel coil is that the space for disposing the induction coil is limited from the viewpoint of apparatus design.

The present invention aims mainly at providing an inductively coupled plasma apparatus that solves the prior art problems mentioned above caused especially by adopting a parallel coil, the apparatus capable of disposing the parallel coil with a large number of coil turns in a relatively narrow space, such as a space for disposing a single-turn coil. Thus, the present invention provides a plasma processing apparatus capable of overcoming the problems of circumferential direction non-uniformity of plasma and the difficulty of apparatus design, and capable of generating a stable and uniform plasma with high efficiency under wider process conditions.

The present invention provides an inductively coupled plasma processing apparatus capable of solving the conventional problem of circumferential non-uniformity of plasma, capable of generating stable plasma at arbitrary locations with high efficiency under wider process conditions.

SUMMARY OF THE INVENTION

The above-mentioned problems can be solved by a configuration described below. That is, a plurality of induction coil elements in parallel connection is not simply disposed vertically or horizontally, but disposed to have a three-dimensional structure, to thereby solve the problem of coil space. Actually, for example, an annular insulating member (insulating ring) having a quadrangular cross-section, for example, is used to dispose four identical coil elements to the four planes of the insulating ring (the lower, inner, upper and outer planes). One coil element circuit extended from a power supply via a matching network is disposed at first on an upper plane of the insulating ring, runs along the outer plane forming a 90° turn, runs along the bottom plane forming a 90° turn, runs along the inner plane forming a 90° turn, and returns to the upper plane where it is connected to ground potential. In this case, the number of turns per one circuit is 90°×3=270° (¾ turns). A total of four coil circuits are disposed in the same manner at even circumferential angular intervals of 90°. At this time, the total number of turns is three. When the coil elements form a 90° turn on the upper plane, one coil circuit totals in 90°×4=360° (one turn), according to which the total number of turns is four. Similarly, by utilizing an insulating ring whose cross-sectional shape is polygonal with n faces (n>4), the number of turns per circuit can be increased. Moreover, by using the insulating ring with a quadrangular cross-section and increasing the turns on a single plane to more than 90°, the number of turns per circuit can be increased.

According to such arrangement, the present invention enables to dispose a parallel coil having a large number of total turns within a limited space.

The present invention provides a plasma processing apparatus comprising a processing chamber for subjecting an object to plasma processing; an inlet means for introducing gases for plasma processing into the processing chamber; an evacuation means for evacuating an interior of the processing chamber; a sample stage for placing the object to be processed; a power supply means for generating plasma in the processing chamber; and at least one induction coil connected to the power supply means, wherein the induction coil is formed by connecting a plurality of identical coil elements in a parallel circuit-like arrangement, the induction coil being positioned so that its center corresponds to a center of the object, and wherein input ends of the coil elements are arranged at equal angular intervals calculated by dividing 360° by the number of coil elements, the coil elements having a three-dimensional structure in a radial direction and a height direction along a surface of an annular ring with an arbitrary cross-sectional shape.

According to the above plasma processing apparatus, the annular ring is an insulating member, and conductor portions of the coil elements are formed on the surface of the insulating member. Moreover, a refrigerant passage is formed to the insulating member for cooling. Even further, the cross-sectional shape of the insulating member is polygonal, and the conductor portions of the coil elements are formed on the surface of the polygonal surface of the insulating member.

According to the present plasma processing apparatus, the cross-sectional shape of the insulating member is circular, and the conductor portions of the coil elements are formed on the surface of the insulating member in a toroidal coil-like shape.

According to the present plasma processing apparatus, the annular ring is a virtual annular ring, and conductor portions of the coil elements are formed along a surface of the virtual annular ring.

In order to solve the conventional problems, the present invention provides a plasma processing apparatus comprising: a processing chamber for subjecting an object to plasma processing; an inlet means for introducing a gas for plasma processing into the processing chamber; an evacuation means for evacuating an interior of the processing chamber; a sample stage for placing the object; a power supply means for generating plasma in the processing chamber; and at least one induction coil connected to the power supply means, wherein the induction coil is formed by connecting a plurality of identical coil elements in a parallel circuit-like arrangement, the coil elements disposed on a surface of an annular ring having an arbitrary cross-sectional shape and formed to rotate along the surface of the annular ring.

According to the present plasma processing apparatus, the annular ring is an insulating member, and conductor portions of the coil elements are formed on the surface of the insulating member. Further according to the present invention, a refrigerant passage is formed to the insulating member for cooling, and further, the cross-sectional shape of the insulating member is polygonal, and the conductor portions of the coil elements are formed on the surface of the polygonal surface of the insulating member.

According to the present plasma processing apparatus, the cross-sectional shape of the insulating member is circular, and the conductor portions of the coil elements are formed on the surface of the insulating member in a toroidal coil-like shape.

According to the present plasma processing apparatus, the annular ring is a virtual annular ring, and conductor portions of the coil elements are formed along a surface of the virtual annular ring.

According to the present plasma processing apparatus, the coil elements are rotated for a predetermined angle at a time in a circumferential direction of the annular ring, by which the coil elements are rotated at a time from one face of the annular ring to a face adjacent thereto. According to another aspect of the invention, the coil elements are rotated continuously.

Furthermore, according to the present plasma processing apparatus, the induction coil is formed so that input ends or output ends of the plural coil elements are disposed at predetermined even angular intervals in the circumferential direction of the annular ring.

According to the present plasma processing apparatus, the annular ring is arranged so that a center thereof corresponds to the center of the object. Moreover, according to the present invention, plural induction coils are arranged concentrically.

According to such configurations, it is possible to dispose a parallel coil having a large number of total turns in a limited space.

According to the present plasma processing apparatus, complete plasma uniformity across the circumferential direction can be achieved. Therefore, the plasma etch result is uniform in the circumferential direction, and since it is necessary only to consider the uniformity in the radial direction when determining plasma etching process conditions, the determination process is facilitated and prompt. As a result, the plasma processing performance and the controllability of the apparatus as a whole is enhanced, and it becomes possible to provide finer etching process with high throughput, and higher quality film deposition and surface treatment.

DETAILED DESCRIPTION OF THE PREFERRED EMBODIMENT

The plasma processing apparatus according to the present invention is not only applied to the field of manufacturing semiconductor devices, but can also be applied to various fields concerning plasma processing, such as the manufacturing of liquid crystal displays, forming of films using various materials and providing surface treatments. In this description, a plasma etching apparatus for manufacturing semiconductor devices is described as an example to illustrate the preferred embodiments.

Figure 1:
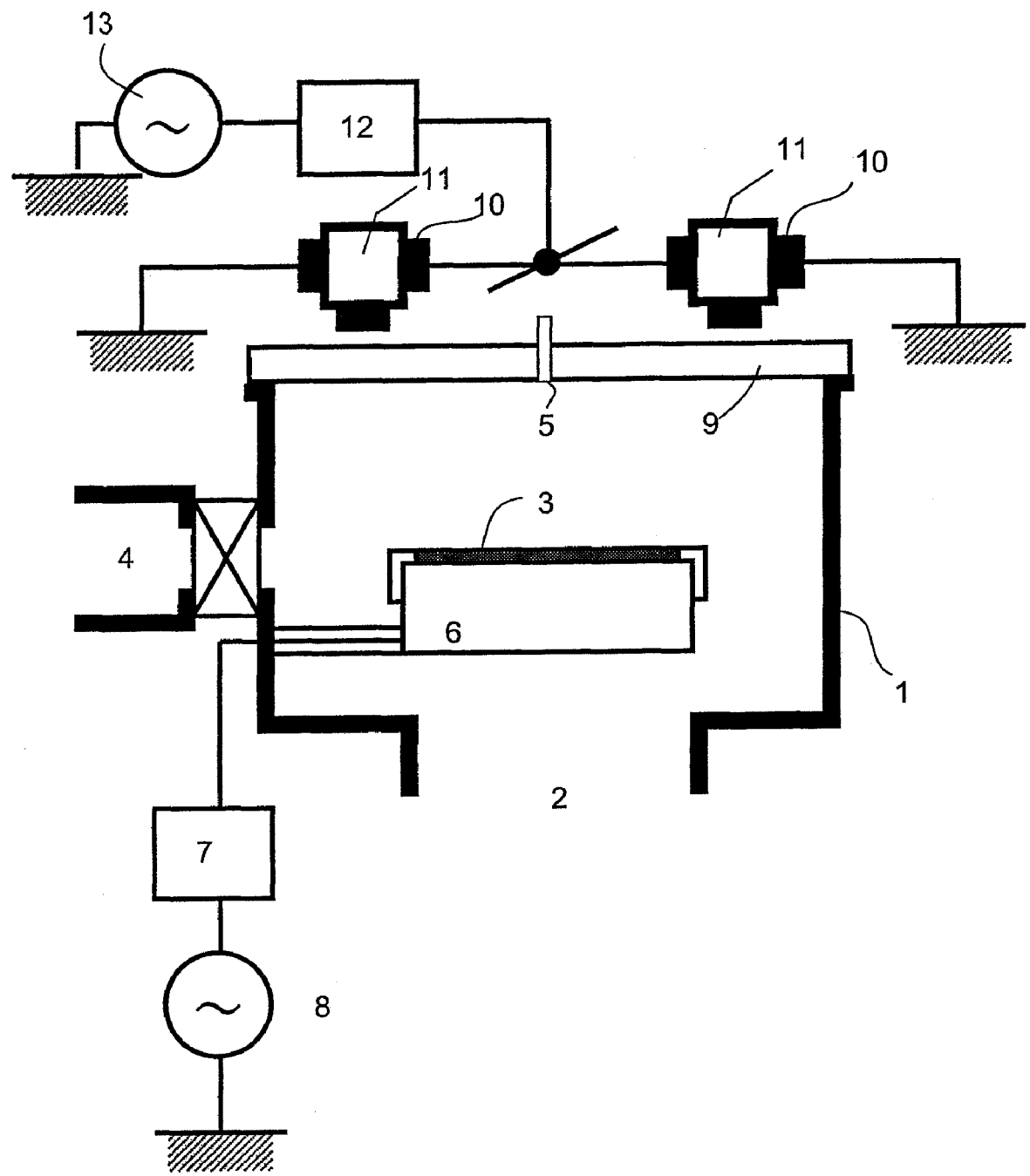
FIG. 1 is an explanatory view showing the arrangement of coil elements of an induction coil corresponding to a first embodiment of the present invention.

With reference to FIG. 1, an arrangement corresponding to a first embodiment of a plasma processing apparatus according to the present invention will be described. An RF inductively coupled plasma processing apparatus comprises a processing chamber 1 maintained in vacuum, an evacuation means 2 connected to a vacuum pump for example for maintaining the interior of the processing chamber in vacuum, a wafer-transfer system 4 for carrying a semiconductor wafer 3 or object to be processed into and out of the vacuum processing chamber, an inlet 5 for introducing processing gas, an electrode 6 on which the semiconductor wafer 3 is placed (sample stage for mounting the object to be processed), a matching network 7, an RF power supply 8, an insulator 9 functioning as the ceiling of the processing chamber and through which the electric field created by radio frequency is introduced to the processing chamber, an RF induction coil 10 having an arrangement unique to the present invention, an annular insulating body (insulating member) 11, a matching network 12 and an RF power supply 13.

The processing chamber 1 is a vacuum vessel made of stainless steel or aluminum with an anodized aluminum surface, which is grounded electrically. The processing chamber 1 is equipped with an evacuation means 2, and a wafer-transfer system 4 for carrying the semiconductor wafer 3 which is the object to be processed into and out of the chamber. Inside the processing chamber 1 is disposed an electrode 6 for placing the semiconductor wafer 3. The wafer carried into the processing chamber via the wafer-transfer system 4 is placed on the electrode 6 and held by the electrode 6. The electrode 6 is connected to an RF power supply 8 through a matching network 7 for the purpose of controlling the ion energy incident on the semiconductor wafer 3 during plasma processing. An etching gas is introduced into the chamber through an inlet 5.

An RF induction coil 10 is disposed in a position confronting the wafer via an insulator 9 formed of quartz or alumina ceramics, on a plane facing the wafer in the atmospheric side of the insulator 9. The RF induction coil 10 is arranged so that its center corresponds to the center of the semiconductor wafer 3. Although not shown, the RF induction coil 10 is composed of plural identical coil elements, and the conducting areas of the coil elements are disposed on a surface of a substantially annular (ring-like) insulating member 11. One end of each of the plural coil elements is connected to the RF power supply 13 via a matching network 12, and the other end is connected to ground potential, in the exact same manner. Although not shown, it is possible to insert a capacitor between the coil elements and the ground potential. When such capacitor is inserted, the distribution of the potential generated in the induction coil is varied, so by adopting an appropriate capacitor, the maximum voltage generated in the coil can be reduced.

The insulating member 11 has a refrigerant passage not shown for cooling, and a fluid such as water, Fluorinert (registered trademark), air or nitrogen can be flown through the passage to cool the insulating member.

An inductively coupled plasma apparatus excites plasma by the RF current applied through the RF induction coil. Generally, when the number of turns (number of windings) is increased, the inductance is increased and the current is reduced but the voltage is raised. When the number of turns is reduced, the voltage is lowered but the current is raised. In designing the inductively coupled plasma apparatus, the preferable levels of current and voltage are determined not only from the viewpoint of uniformity, stability and generation efficiency of plasma but also from the viewpoint of mechanical engineering. For instance, the increase of current may cause problems such as heating and the loss caused thereby, or the current resistance of a variable capacitor used in the matching network. On the other hand, the increase of voltage may cause problems such as abnormal discharge, undesirable affect to plasma, or the voltage resistance of the variable capacitor. Therefore, the designer must determine the shape of the coil and the number of turns thereof considering the current and voltage resistance of electric elements such as variable capacitors in the matching network, and the problems related to cooling the coils.

Figure 2:
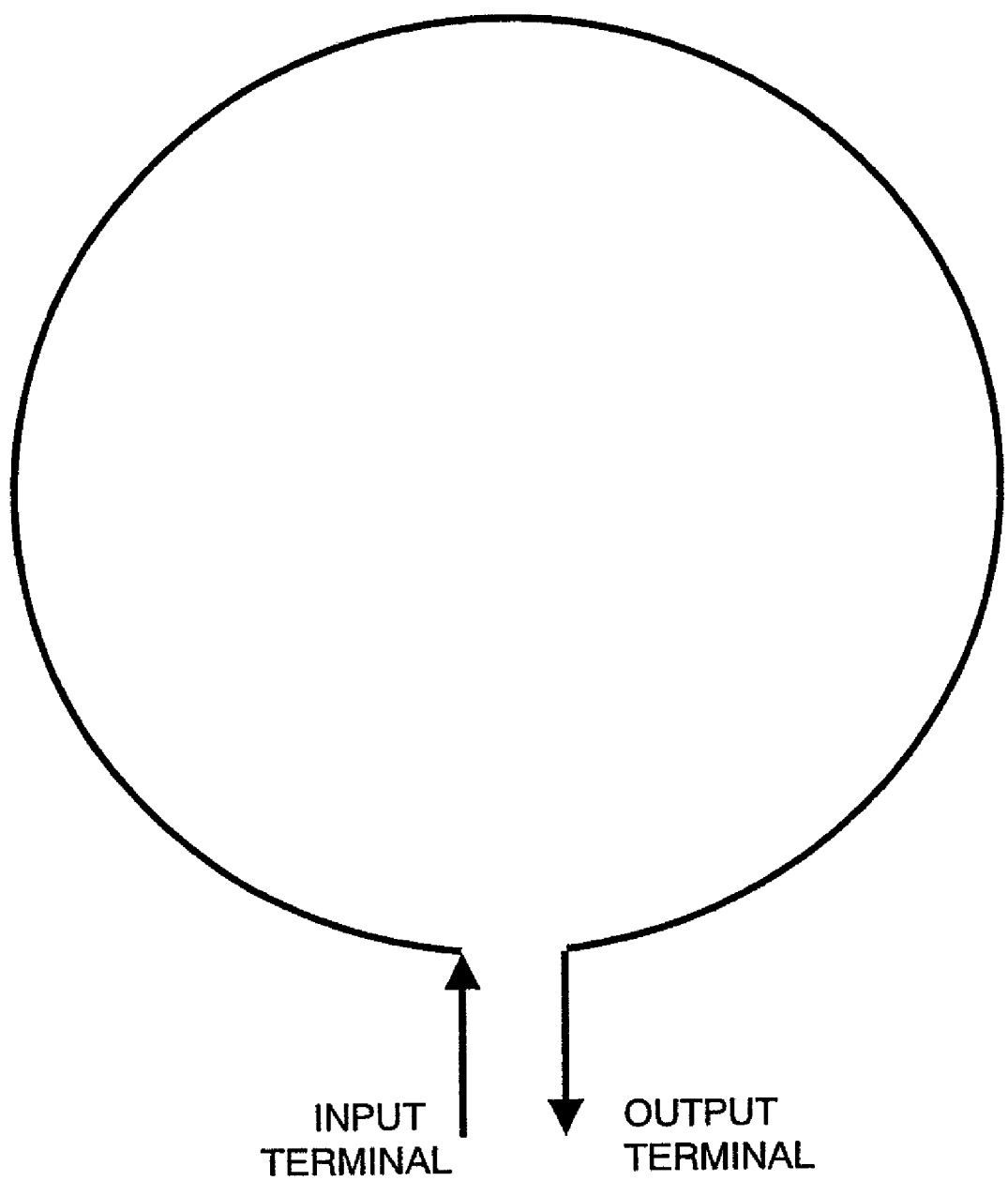
FIG. 2 is an explanatory view showing a shape of a coil element of an induction coil used in a plasma etching apparatus.
Figure 3:
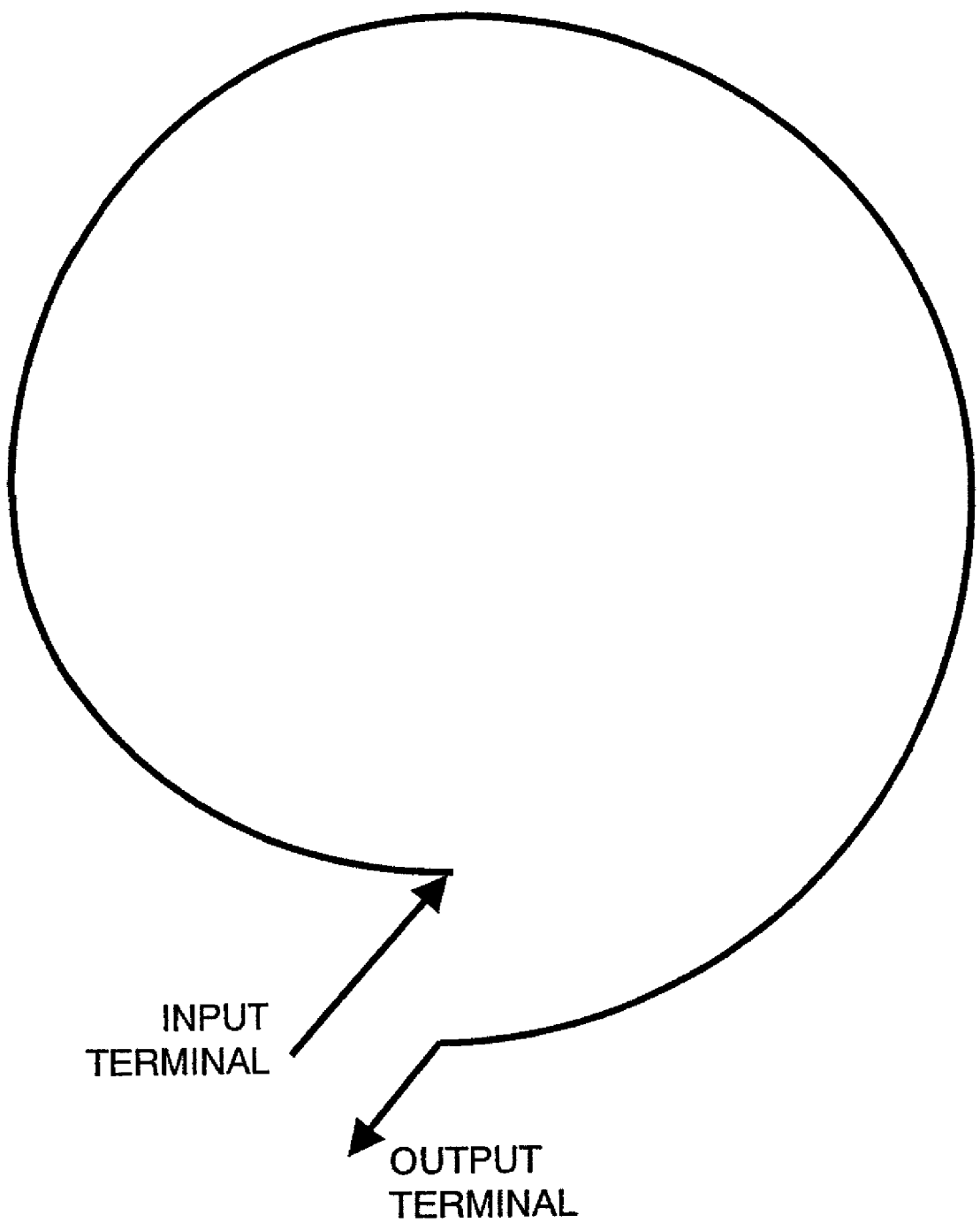
FIG. 3 is an explanatory view showing a modified example of an induction Coil.

Now, we will consider a simple loop coil like the one shown in FIG. 2. We will assume that the inductance of this loop coil is 1 µH. If plasma is generated using this loop coil as described earlier, the plasma will be biased by the effect of input and output terminals disposed at the neck of the coil. Next, we will consider a loop coil similar to the loop coil of FIG. 2 but is somewhat helically expanded as illustrated in FIG. 3. Since the overall diameter of the coil is substantially the same, the inductance of the loop coil of FIG. 3 is also approximately 1 µH.

Figure 4:
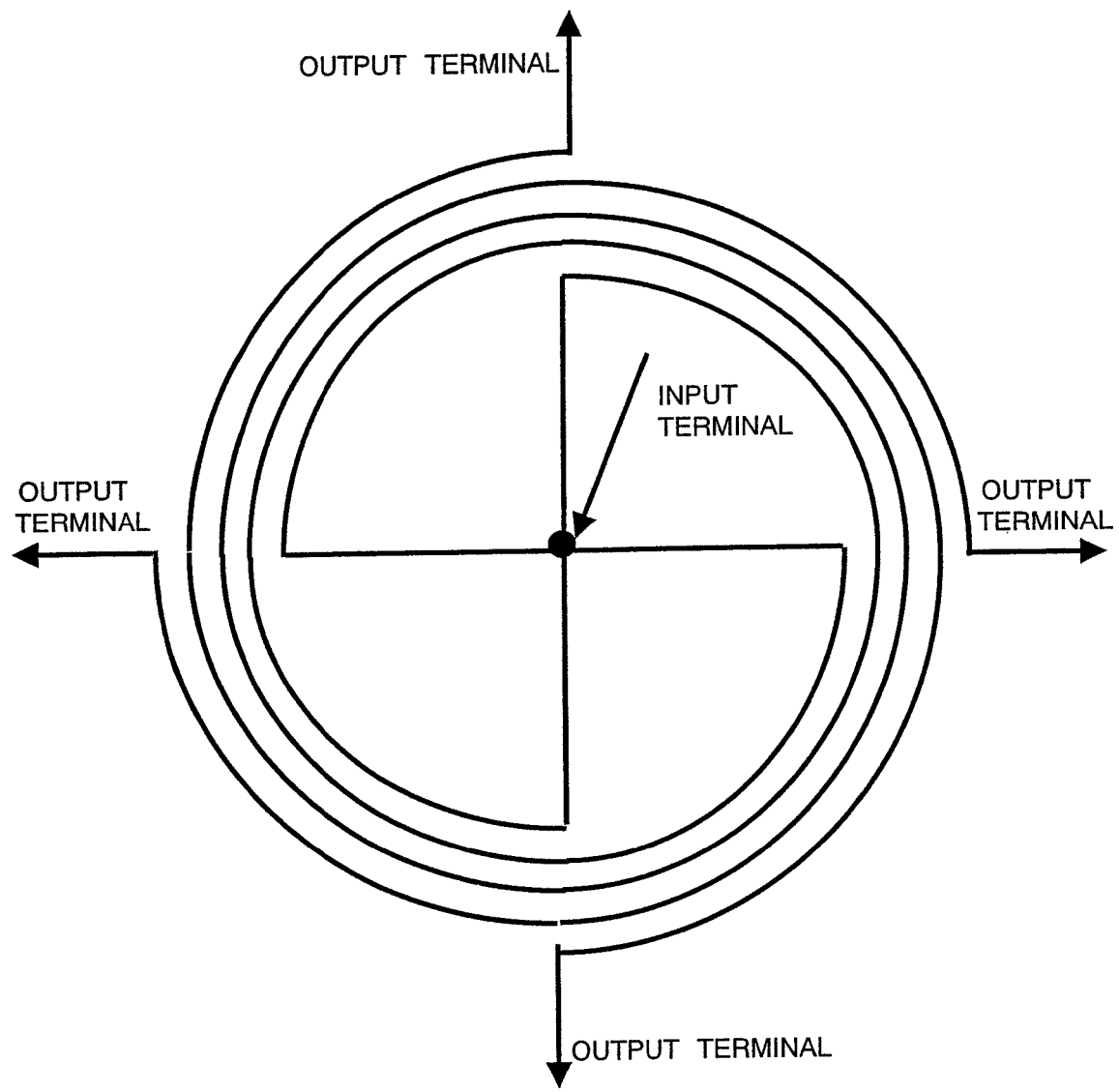
FIG. 4 is an explanatory view showing the connection of an induction coil according to the present invention.

When four such loop coils are prepared and arranged at 90° equal angular intervals, an arrangement as illustrated in FIG. 4 is provided. If the four coil ends disposed at the center are gathered as one input terminal and connected to the RF power supply, and the four outer coil terminals functioning as output terminals are set to ground potential, the arrangement functions as an induction coil. The use of such coil may cause plasma to be somewhat distorted, but will not cause the plasma to be biased. Theoretically, the shape of the plasma will approximate a true circle by increasing the number of coil elements to more than four, but since this causes complication, two to four coil elements are often used in actual application. If four coils each having an inductance of 1 µH are totally independently connected in parallel, the inductance will be ¼ or 0.25 µH, but in the arrangement illustrated in FIG. 4, mutual induction is caused by the adjacent coils, so the inductance will not be reduced to ¼. Non-patent document 2 discloses a plasma apparatus having four coil circuits disposed at 90° intervals, similar to the arrangement of FIG. 4. The same document discloses that by connecting four coil circuits of the same shape in parallel, the inductance is reduced to 57% that of a single coil circuit. The voltage E applied to the coil is provided by equation $E = I \cdot Z$, in which I represents the current of the coil and Z represents impedance. According to equation $Z = 2\pi f \cdot L$ in which f represents the power supply frequency, the reduction of inductance causes the voltage generated in the coil to be reduced and the current to be increased when the same power is supplied.

Now, we will assume that an induction coil is designed so that the inductance of the induction coil is set to a certain value (for example, 1 µH) from the viewpoint of current and voltage resistance of the matching network. By adopting an induction coil having an inductance of 1 µH with a single turn, such as the ones shown in FIGS. 2 and 3, the total number of turns of the coil is, of course, one. On the other hand, by arranging four turns of coils, each turn being 90°, that are electrically mutually connected in parallel so as to uniformize the plasma in the circumferential direction, the inductance is 0.57 µH and the total number of turns is four. This inductance is too low, so in order to realize 1 µH inductance with four parallel coil circuits, it is assumed that coils having approximately 1.5 turns (estimate) per circuit are required. In other words, it is understood that by adopting the parallel coil arrangement illustrated in FIG. 4, the total number of turns of the coil must be increased significantly in order to achieve the same inductance as that of the single coil. In order to achieve the same inductance as that of one turn of a single coil by the arrangement having four circuits of coils connected in parallel, a total of six turns of coils must be provided, each coil circuit having 1.5 turns.

Figure 5:
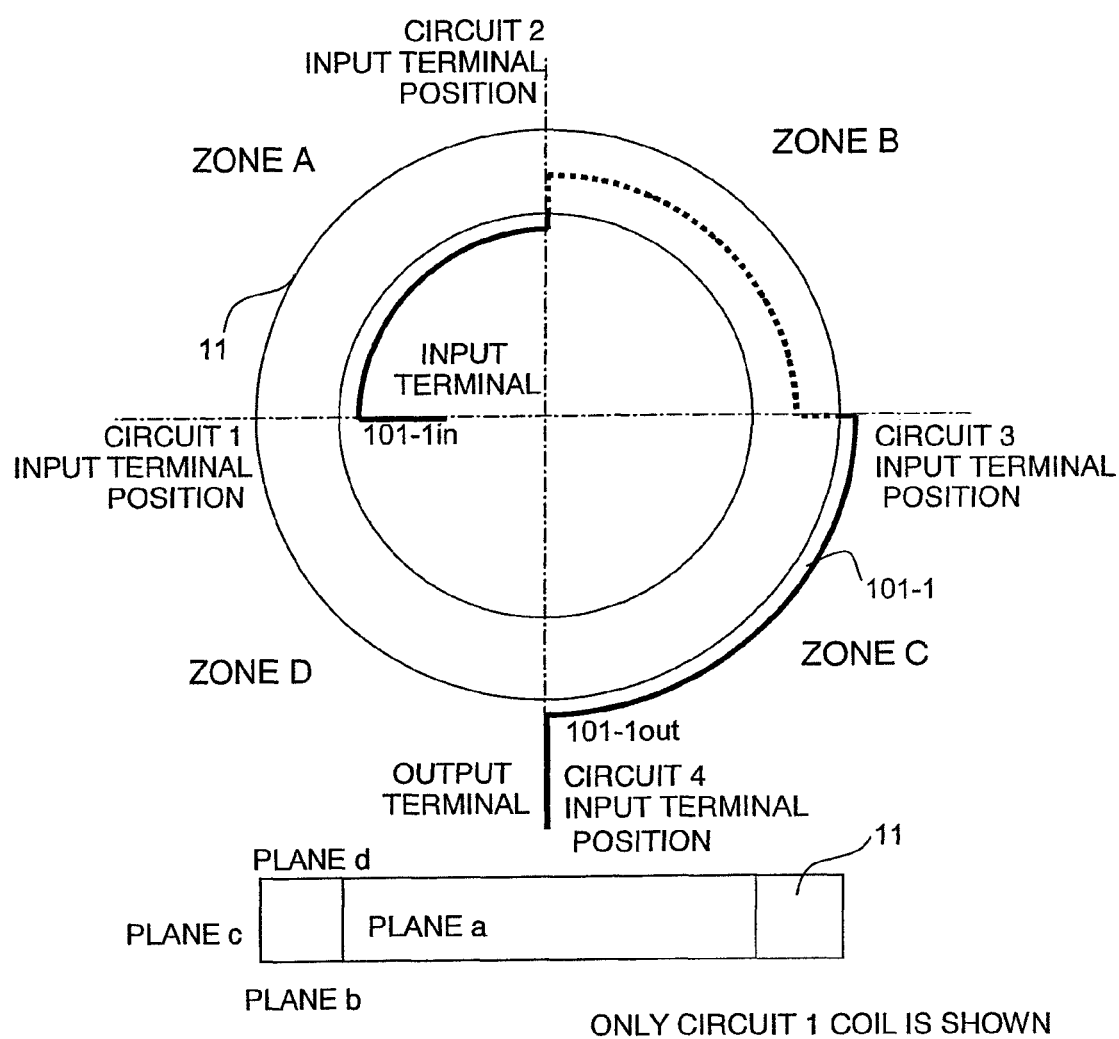
FIG. 5 is an explanatory view showing the arrangement of coil elements of an induction coil corresponding to a second embodiment of the present invention.

The present invention discloses an advantageous induction coil structure regarding the parallel coil arrangement with a large number of turns. At first, as illustrated in FIG. 5 (embodiment 2), a ring-like insulating member with a quadrangle cross section (insulating ring) 11 is prepared. The inner plane of the insulating ring 11 is defined as plane a, the bottom plane as plane b, the outer plane as plane c and the top plane as plane d. Further, the insulating ring 11 is divided at 90° intervals into four zones, and each zone is defined as zone A, zone B, zone C and zone D, respectively as shown in FIG. 5. In the embodiment of FIG. 5, four circuits of coil elements 101 are used. A coil element 101-1 of circuit 1 starts at input terminal 101-1in, passes plane a in zone A, and thereafter, passes planes b and c to reach an output terminal 101-1out, according to which a loop of 270° (¾ turn) in total is formed.

As shown in table 1, the coil element of circuit 2 is displaced by 90° in the clockwise direction from the first coil circuit, and starts at an input terminal and passes plane a in zone B, plane b in zone C and plane c in zone D to form a total of ¾ turn. A coil element 101-3 of circuit 3 and a coil element 101-4 of circuit 4 are each displaced by 90° in the clockwise direction from the preceding circuit.

TABLE 1

Planes used: 3, ¾-turn circuits: 4, total turns: 3

|  | Zone A | Zone B | Zone C | Zone D |
|---|---|---|---|---|
| Circuit 1 | plane a | plane b | plane c |  |
| Circuit 2 |  | plane a | plane b | plane c |
| Circuit 3 | plane c |  | plane a | plane b |
| Circuit 4 | plane b | plane c |  | plane a |

Figure 6:
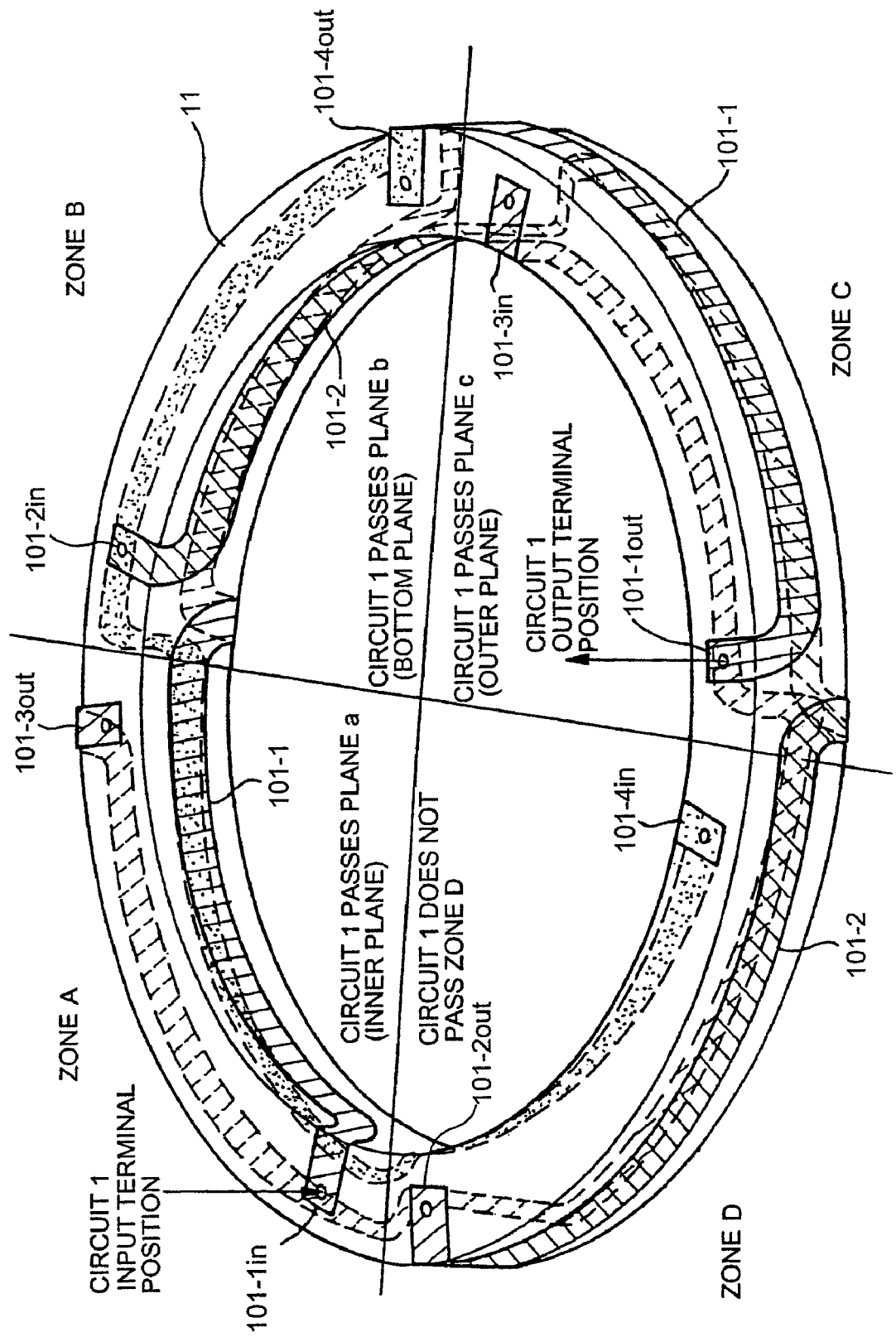
FIG. 6 is a perspective view showing the arrangement of coil elements of an induction coil corresponding to a third embodiment of the present invention.

In this example, four circuits of ¾-turn coil elements are used, totaling in three turns. FIG. 6 is a perspective view showing the actual coil formed in this manner (embodiment 3) where 101-1, 101-2, 101-3 and 101-4 denote the first, second, third and fourth induction coil elements, each of which has ¾ turns respectively. Reference numbers 101-1in and 101-1out denote the input and output end of the first coil element 101-1, respectively. Also, 101-2in, 101-2out, 101-3in, 101-3out, 101-4in, and 101-4out correspond to the input and output end of the second, third, and fourth coil elements, respectively. Unlike the example shown in FIG. 4 where the coil elements are disposed flatly, the present embodiment utilizes space advantageously and successfully creates a compact induction coil 10. By adopting this induction coil to the plasma processing apparatus illustrated in FIG. 1, it is possible to provide a plasma processing apparatus having advantageous circumferential plasma uniformity.

In the example of Table 1, each coil element is passed via adjacent planes, from plane a to plane b to plane c, but it is also possible to have the coil pass via plane a to plane c and then to plane b, as shown in Table 2. It may seem irrational to pass the coil from plane a directly to plane c, but since these planes are in confronting relations, the coil can be passed through a bore pierced through the insulating ring 11.

TABLE 2

Planes used: 3, ¾-turn circuits: 4 (90° each), total turns: 3

|  | Zone A | Zone B | Zone C | Zone D |
|---|---|---|---|---|
| Circuit 1 | plane a | plane c | plane b |  |
| Circuit 2 |  | plane a | plane c | plane b |
| Circuit 3 | plane b |  | plane a | plane c |
| Circuit 4 | plane c | plane b |  | plane a |

Figure 7:
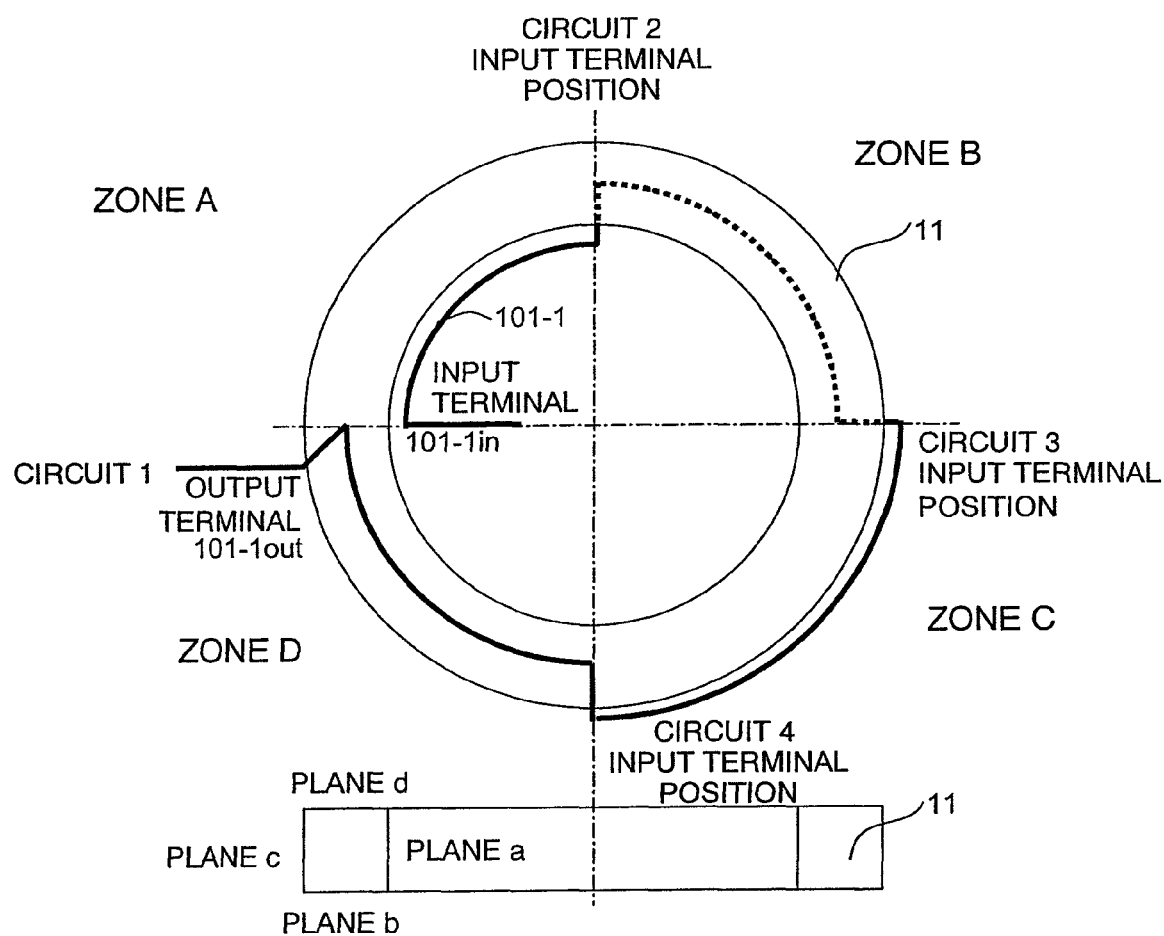
FIG. 7 is an explanatory view showing the arrangement of coil elements of an induction coil corresponding to a fourth embodiment of the present invention.

Further, by utilizing plane d in addition to planes a, b and c for arranging the coil elements, an example illustrated in FIG. 7 (embodiment 4) and table 3 is achieved, in which circuit 1 is started at input terminal 101-1in and extends via plane a, plane b, plane c and plane d and terminates at output terminal 101-1out, and circuits 2, 3 and 4 are disposed in a similar manner but displaced by 90°, respectively, according to which an induction coil with a total of four turns using four circuits (one turn per circuit) is formed (which is considered to be substantially similar to the example of FIG. 4).

TABLE 3

Planes used: 4, 1-turn circuits: 4, total turns: 4

|  | Zone A | Zone B | Zone C | Zone D |
|---|---|---|---|---|
| Circuit 1 | plane a | plane b | plane c | plane d |
| Circuit 2 | plane d | plane a | plane b | plane c |
| Circuit 3 | plane c | plane d | plane a | plane b |
| Circuit 4 | plane b | plane c | plane d | plane a |

Figure 8:
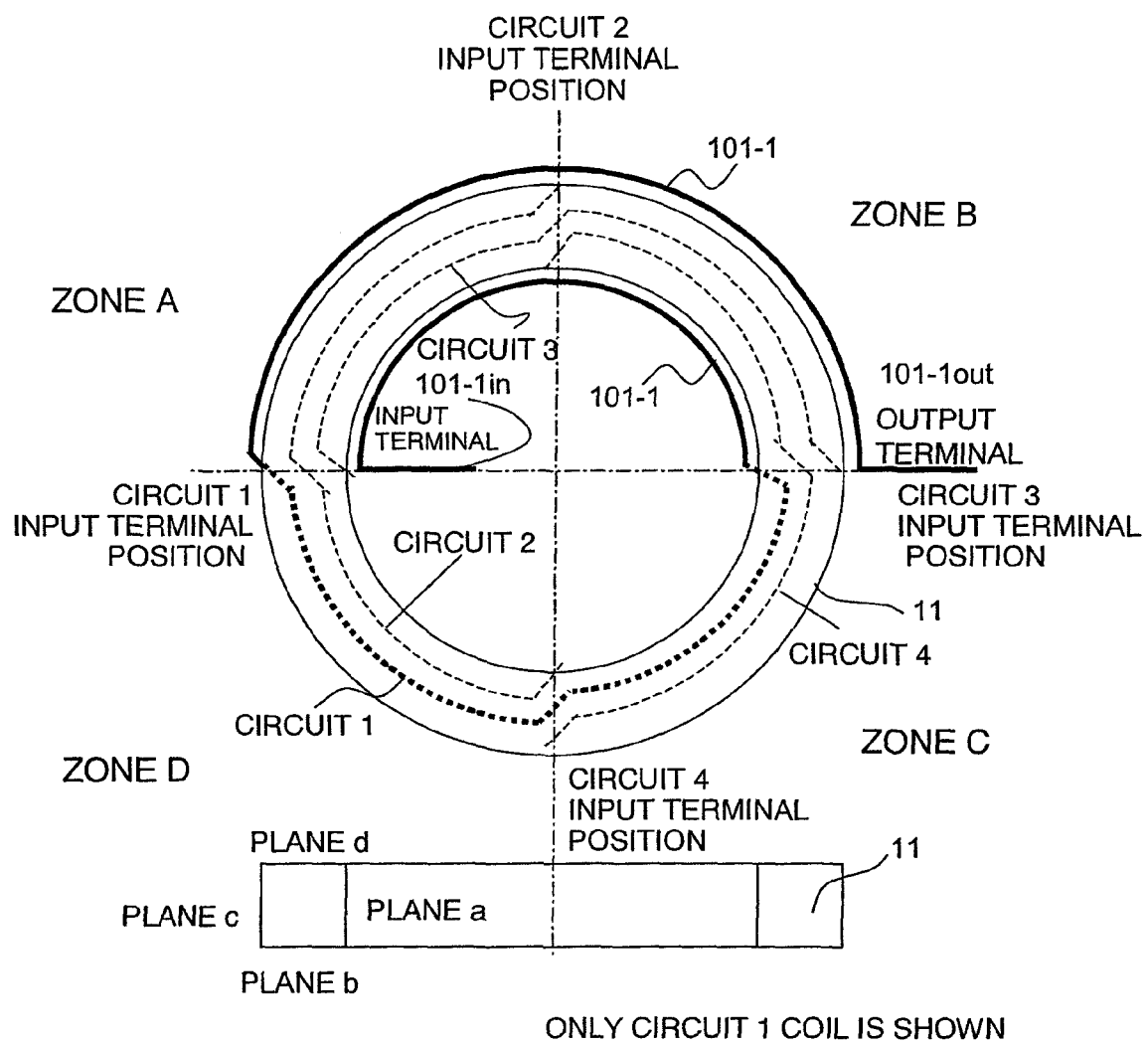
FIG. 8 is an explanatory view showing the arrangement of coil elements of an induction coil corresponding to a fifth embodiment of the present invention.

Next, an embodiment with increased number of turns is illustrated with reference to FIG. 8 (embodiment 5) and table 4. According to the previous embodiments, each plane had a 90-degree loop per circuit arranged thereto, but according to the present embodiment, a plane has two 180° loop circuits, and a single circuit uses three planes to turn 540°, according to which the number of turns is increased. In other words, a coil element 101-1 of circuit 1 is disposed on plane a in zones A and B, plane b in zones C and D, and plane c in zones A and B, transferring from one plane to another after forming 180° loops. However, in this example, there are four coil circuits, so one plane must be shared by adjacent loops. That is, as illustrated in FIG. 8 and table 4, the coil element 101-1 of circuit 1 shares planes a and c with coil circuit element 2 in zone B, shares plane b with coil circuit element 4 in zone C, shares plane b with circuit 2 in zone D, and shares planes a and c with circuit 4 in zone A, each sharing 90°. In this embodiment, since three planes are used and each coil circuit has 3/2 turns, the total number of turns of the coils is six.

TABLE 4

| | Zone A | Zone B | Zone C | Zone D | Zone A | Zone B | Zone C | Zone D |
|---|---|---|---|---|---|---|---|---|
| Planes used: 3, ½-turn circuits: 4, total turns: 6 | | | | | | | | |
| Circuit 1 | plane a | plane a | plane b | plane b | plane c | plane c | | |
| Circuit 2 | | plane a | plane a | plane b | plane b | plane c | plane c | |
| Circuit 3 | | | plane a | plane a | plane b | plane b | plane c | plane c |
| Circuit 4 | plane c | | | plane a | plane a | plane b | plane b | plane c |

Figure 9:
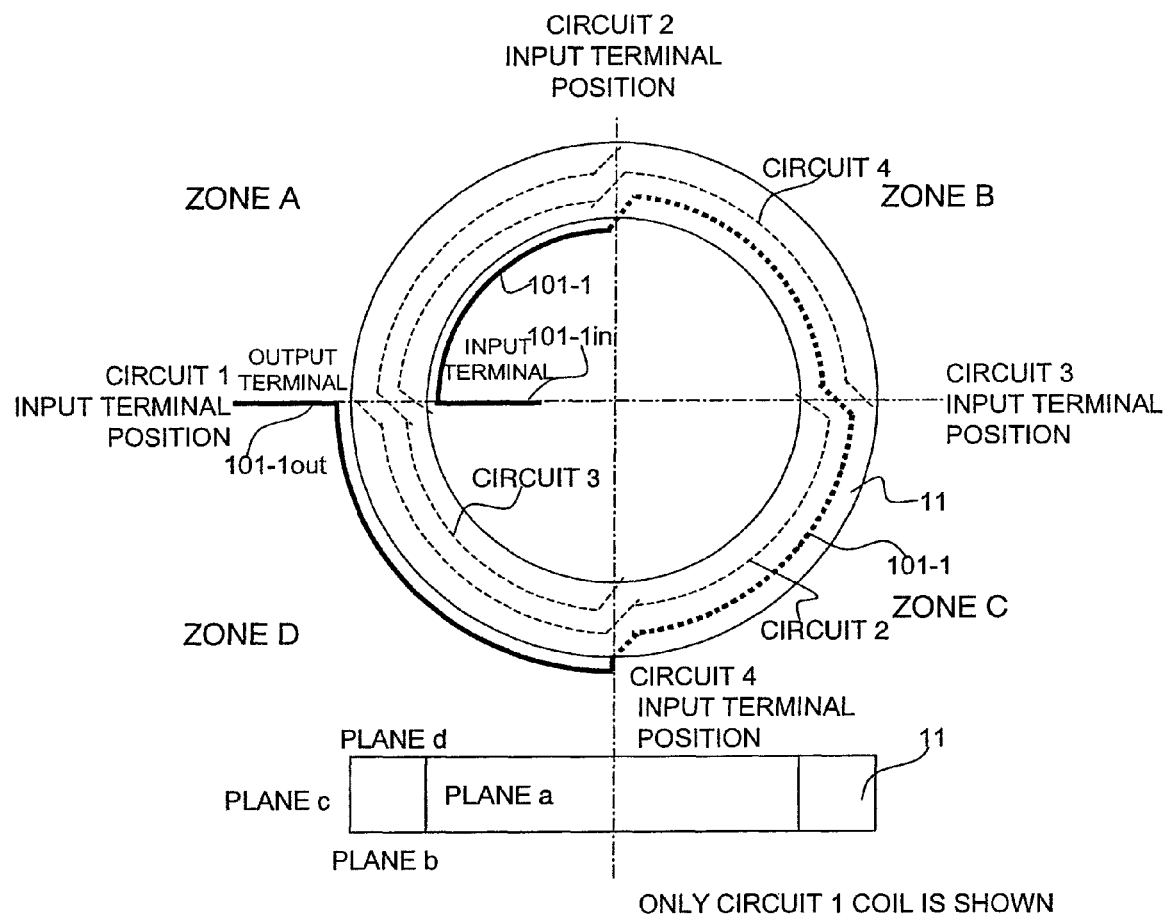
FIG. 9 is an explanatory view showing the arrangement of coil elements of an induction coil corresponding to a sixth embodiment of the present invention.

Furthermore, FIG. 9 (embodiment 6) and table 5 are referred to in explaining a modified example of FIG. 8. This embodiment forms the 180° loop to only a certain plane. For example, the 180° loop is disposed only on plane b and 90° loops are disposed on planes a and c. Thus, circuit 1 shares plane b with circuit 4 in zone B and with circuit 2 in zone C, each for 90°. As for planes a and c, each zone is used independently by each circuit. Since the coupling property of the induction coil to plasma is higher when the coil is closer to the plasma, in a plasma apparatus of the type shown in FIG. 1, it is advantageous to use plane b (bottom plane) to dispose longer coil loops (or to arrange greater number of coil turns on plane b). According to the present embodiment, three planes are used to dispose four single-turn circuits, so there are four turns in total.

TABLE 5

| | Zone A | Zone B | Zone C | Zone D |
|---|---|---|---|---|
| Planes used: 3, 1-turn circuits: 4, total turns: 4 | | | | |
| Circuit 1 | plane a | plane b | plane b | plane c |
| Circuit 2 | plane c | plane a | plane b | plane b |

TABLE 5-continued

| | Zone A | Zone B | Zone C | Zone D |
|---|---|---|---|---|
| Planes used: 3, 1-turn circuits: 4, total turns: 4 | | | | |
| Circuit 3 | plane b | plane c | plane a | plane b |
| Circuit 4 | plane b | plane b | plane c | plane a |

Figure 10:
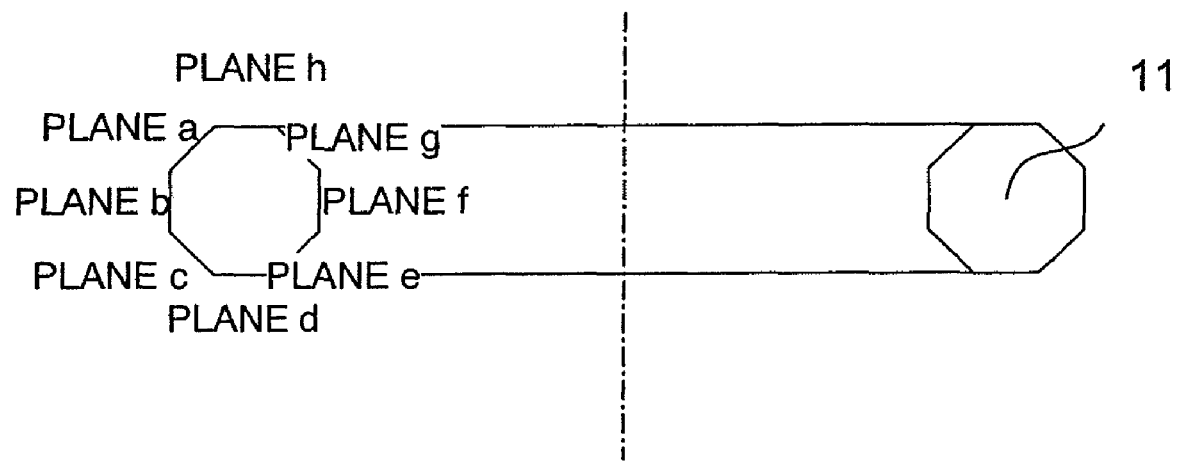
FIG. 10 is an explanatory view showing the arrangement of coil elements of an induction coil corresponding to a seventh embodiment of the present invention.

In order to increase the number of turns, it may be possible to use an insulating ring 11 having a polygonal cross-section with more than four sides. This embodiment 7 will be illustrated with reference to FIG. 10 and table 6. The present embodiment uses an insulating ring 11 with an octagonal cross-section. The surfaces are denoted as planes a through h as illustrated, and through use of seven planes excluding the upper plane, plane h, coil loops are arranged in a manner similar to the embodiment of FIG. 5, wherein the coil element of circuit 1 is first disposed on plane a in zone A and extended via planes b, c, d, e, f and g transiting planes every 90°, and the coil element of circuit 2 is first disposed on plane a in zone B and extended via planes b, c, d, e, f and g transiting planes every 90°, thereby forming loops. A single coil element circuit constitutes 7/4 turns, so by disposing four circuits, the induction coil totals in seven turns.

TABLE 6

| | Zone A | Zone B | Zone C | Zone D | Zone A | Zone B | Zone C | Zone D |
|---|---|---|---|---|---|---|---|---|
| Planes used: 7, ⅞-turn circuits: 4 (90° each), total turns: 7 | | | | | | | | |
| Circuit 1 | plane a | plane b | plane c | plane d | plane e | plane f | plane g | |
| Circuit 2 | | plane a | plane b | plane c | plane d | plane e | plane f | plane g |
| Circuit 3 | plane g | | plane a | plane b | plane c | plane d | plane e | plane f |
| Circuit 4 | plane f | plane g | | plane a | plane b | plane c | plane d | plane e |

The embodiments up to now have illustrated various induction coils formed of four coil element circuits connected in parallel, but the number of coils can be, of course, two, three, or more than four.

Figure 11:
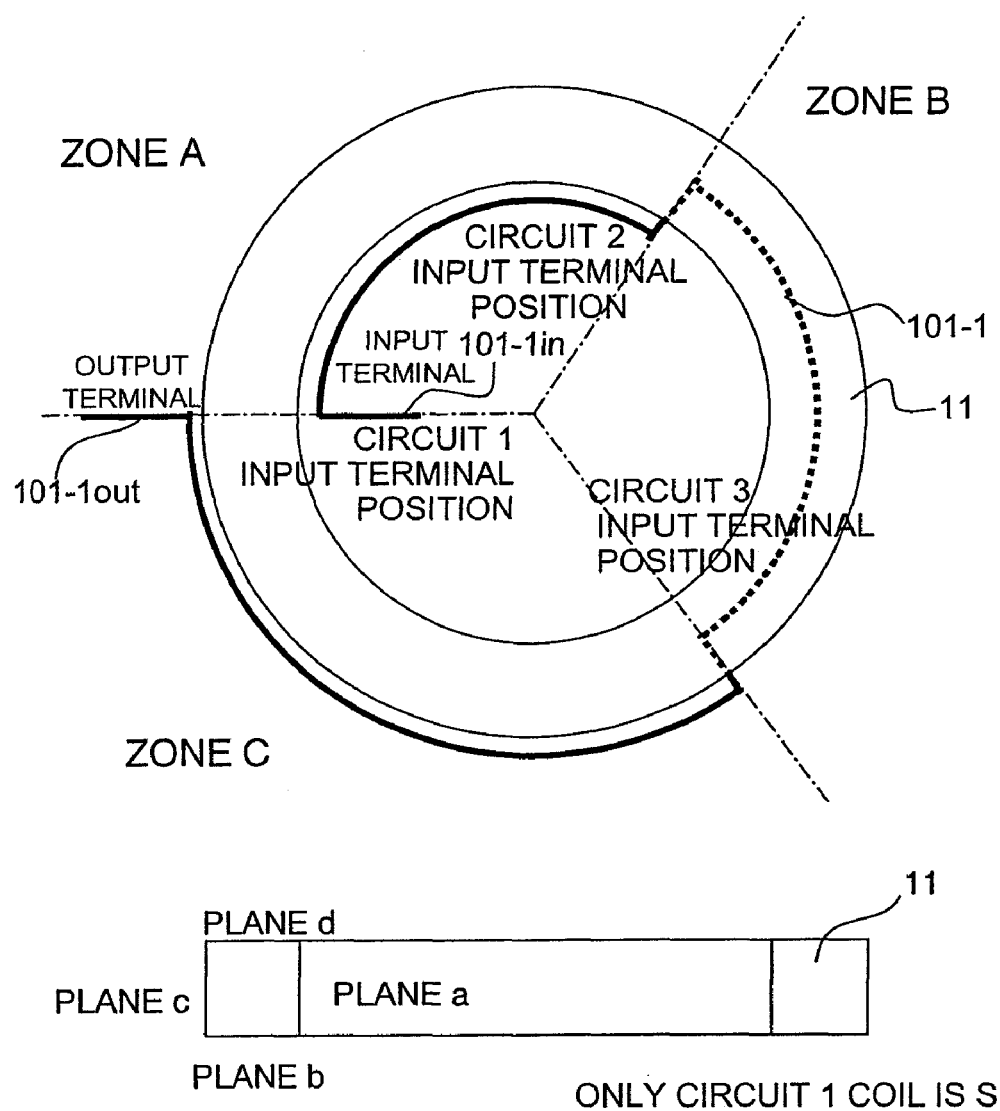
FIG. 11 is an explanatory view showing the arrangement of coil elements of an induction coil corresponding to an eighth embodiment of the present invention.

FIG. 11 and table 7 illustrate embodiment 8 in which three coil element circuits are used. According to the present embodiment, one coil element is disposed to transfer from plane a to plane b and then to plane c forming 120° loops on each plane. A single coil element circuit forms a single turn, so by disposing three coil circuits, an induction coil having three turns in total is provided.

TABLE 7

Planes used: 3, 1-turn circuits: 3 (120° each), total turns: 3

|  | Zone A | Zone B | Zone C |
|---|---|---|---|
| Circuit 1 | plane a | plane b | plane c |
| Circuit 2 | plane c | plane a | plane b |
| Circuit 3 | plane b | plane c | plane a |

In forming an induction coil, it is advantageous to use an insulating ring 11 having a polygonal cross-section. The coil elements can be formed of copper sheets or the like, and can be secured via screws onto the insulating ring 11 to maintain shape. It is also possible to form coil elements 101 by depositing plating on the surface of the insulating ring 11 and forming the coil pattern via etching or the like. There is much heat generated in the induction coil since a large amount of current is passed through. If the insulation coil is formed of a single continuous spiral coil with a simple structure, it is possible to cool the coil by forming a refrigerant passage in the coil, for example. However, if the insulating coil is formed of parallel-connection coil elements with complicated structure, it is difficult to form a refrigerant passage in the interior of the coil to cool the same. Advantageously according to the present invention, the entire complex coil arrangement can be cooled effectively by simply circulating a refrigerant in the interior of the insulating ring 11.

Figure 12:
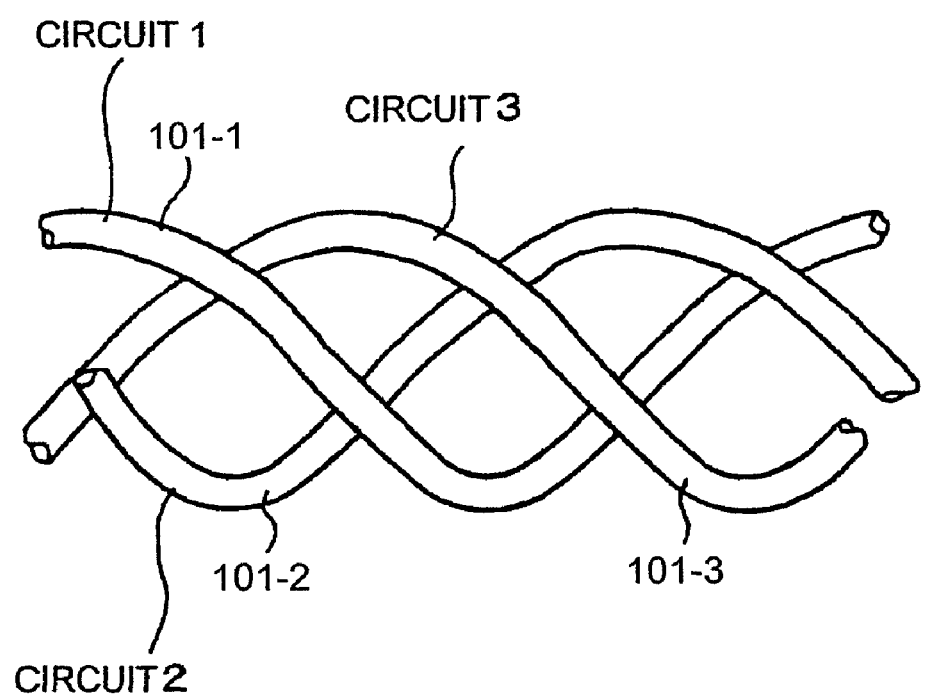
FIG. 12 is an explanatory view showing the arrangement of coil elements of an induction coil corresponding to a ninth embodiment of the present invention.
Figure 13:
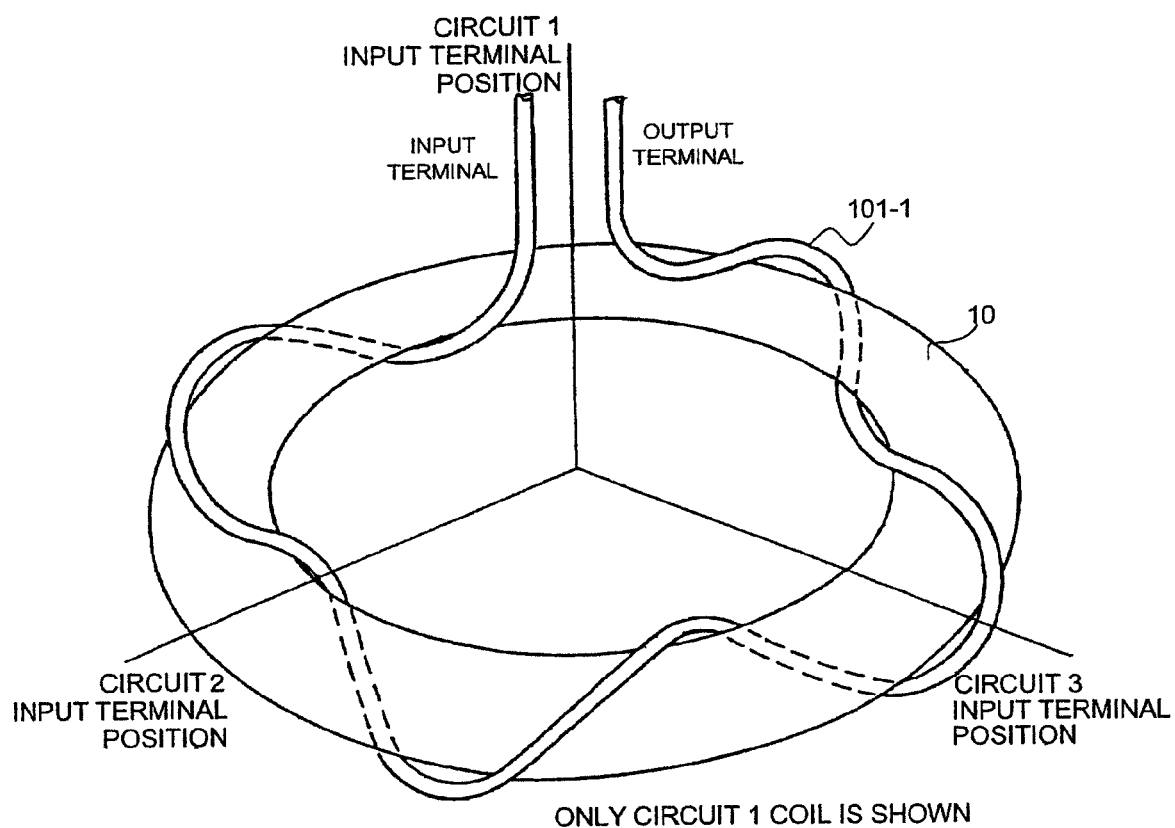
FIG. 13 is an explanatory view showing how the coil element of the induction coil is disposed according to the ninth embodiment of the present invention.

According to the above description, coil loops of given angles were disposed on the planes of the insulating ring 11 having a polygonal cross-section. However, it is possible to form the insulating ring 11 to have a round cross-section, which is an ultimate polygon. According to such example, however, it is not possible to denote the planes as plane a, plane b and so on as in the case of previous embodiments. Therefore, as illustrated in FIGS. 12 and 13 (embodiment 9), the coil elements 101 can be arranged in the form of a toroidal coil in which each coil is displaced from the other coil by given angles. According to this example, the coil element 101 runs smoothly on the surface of the annular ring and disposed in a three-dimensional fashion.

Figure 14:
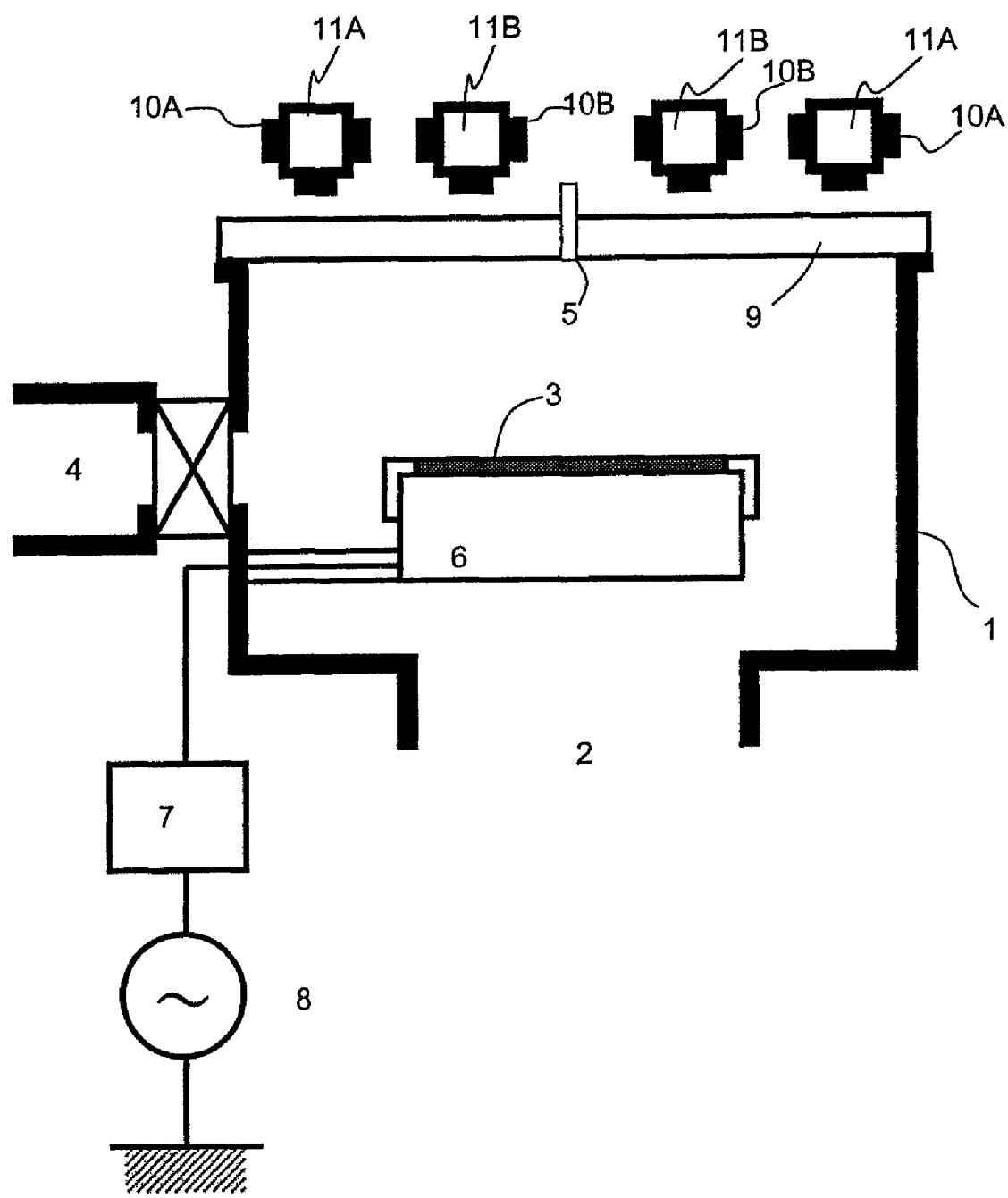
FIG. 14 is an explanatory view showing the arrangement of coil elements of an induction coil corresponding to a tenth embodiment of the present invention.

The induction coil can be formed compactly according to the present invention, so it is possible to facilitate the control of plasma distribution, for example, as shown in FIG. 14 (embodiment 10) by disposing two induction coils 10A and 10B provided on respective insulating rings 11A and 11B in comparison to a single induction coil 10 provided on an insulating ring 11 as shown in FIG. 1 (embodiment 1), where the coil 10A is disposed concentrically outward of the coil 10B, and by controlling the current ratio supplied thereto.

The present invention does not necessarily require the insulating ring 11, and as long as the shape of the induction coil is maintained, it is possible to omit the insulating ring and to dispose the coil elements on a surface of a virtual annular ring.

What is claimed is:

1. A plasma processing apparatus comprising:
a processing chamber for subjecting an object to plasma processing;
means for introducing a gas for plasma processing into the processing chamber;
means for evacuating an interior of the processing chamber;
a sample stage for mounting of the object;
a radio-frequency power supply which enables generation of plasma in the processing chamber; and
at least one induction coil connected to the radio-frequency power supply;
wherein the induction coil is formed by connecting a plurality of identical coil elements in a parallel circuit-like arrangement so that a same radio-frequency voltage is applied to each of the plurality of identical coil elements;
wherein each input terminals of the identical coil elements is displaced at intervals of an angle calculated by dividing 360° by the number of identical coil elements; and
wherein continuous conductor portions of the identical coil elements are formed on different adjacent surfaces of an annular ring and constituted so as to be displaced from one another for a predetermined angle at a time so as to extend along a circumferential direction of the different adjacent surfaces of the annular ring, by which the conductor portions of the coil elements are disposed so as to be displaced at a time from one surface of the annular ring to another surface adjacent thereto while extending in the circumferential direction so that the identical coil elements are respectively arranged three-dimensionally in a radial direction and a height direction of the annular ring.

2. The plasma processing apparatus according to claim 1, wherein the annular ring is an insulating member.

3. The plasma processing apparatus according to claim 1, wherein the annular ring is an insulating member, conductor portions of the identical coil elements are formed on a surface of the insulating member, and a refrigerant passage for cooling is formed to the insulating member.

4. The plasma processing apparatus according to claim 1, wherein the annular ring is an insulating member, a cross-sectional shape of the annular ring is polygonal, and the continuous conductor portions of the identical coil elements are formed so as to extend in the circumferential direction on adjacent surfaces of the annular ring having the polygonal cross sectional shape.

5. The plasma processing apparatus according to claim 1, wherein the annular ring is a virtual annular ring, and conductor portions of the identical coil elements are respectively formed along a surface of the virtual annular ring.

* * * * *